Figure 1:
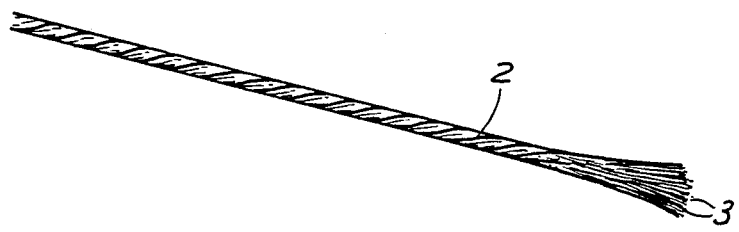

United States Patent [19]

Honour

[11] Patent Number: 4,978,814
[45] Date of Patent: Dec. 18, 1990

[54] ELECTRICAL DEVICE INCLUDING AN ELECTRICAL CONNECTOR

[75] Inventor: Andrew M. Honour, Amersham, England

[73] Assignee: Thorn EMI plc, London, England

[21] Appl. No.: 308,930

[22] Filed: Feb. 13, 1989

[30] Foreign Application Priority Data

Feb. 16, 1988 [GB] United Kingdom ............... 8803519

[51] Int. Cl.$^5$ .............................................. H01R 4/04
[52] U.S. Cl. ............... 174/130 R; 174/128.1; 219/543; 338/329
[58] Field of Search ............... 174/94 R, 128.1, 130, 174/261; 219/541, 543; 338/329

[56] References Cited

U.S. PATENT DOCUMENTS

| | | | |
|---|---|---|---|
| 546,005 | 9/1895 | Dion | 174/129 R |
| 1,986,339 | 1/1935 | Hartzell | 361/307 |
| 2,600,485 | 6/1952 | Cox | 219/541 |
| 3,157,734 | 11/1964 | Derkas | 174/261 X |
| 3,182,118 | 5/1965 | De Proost et al. | 174/94 R |
| 3,207,838 | 9/1965 | McCormack | 174/261 X |
| 3,643,133 | 2/1972 | Towell | 174/261 X |
| 4,069,410 | 1/1978 | Keep, Jr. | 174/113 R X |
| 4,108,701 | 8/1978 | Stanley | 174/47 X |
| 4,521,476 | 6/1985 | Asai et al. | 174/261 X |
| 4,634,805 | 1/1987 | Orban | 174/128.1 |
| 4,719,317 | 1/1988 | Reynolds et al. | 338/329 X |

FOREIGN PATENT DOCUMENTS

| | | | |
|---|---|---|---|
| 448489 | 5/1948 | Canada | 174/128.1 |
| 1847 | of 1904 | United Kingdom | 174/128.1 |

Primary Examiner—Morris H. Nimmo
Attorney, Agent, or Firm—Fleit, Jacobson, Cohn, Price, Holman & Stern

[57] ABSTRACT

An electrical connector for making a connection to a thick film track comprises a plurality of conductive fibres braided together, each of the fibres having a diameter so as to provide sufficient stiffness to the connector and to permit adhesion of the connector to a thick film track.

6 Claims, 1 Drawing Sheet

ELECTRICAL DEVICE INCLUDING AN ELECTRICAL CONNECTOR

This invention relates to electrical connectors for making connections to thick film conductor tracks. In particular, though not exclusively, this invention relates to electrical connectors for connection to heating elements comprising thick film tracks, where the electrical connectors must have a high current carrying capacity to be able to carry the high power required of the heating element.

It is known to make connections to thick film conductor tracks using gold or aluminium wire having a diameter of the order of tens of micrometers. The wire is welded to the track by ultrasonic welding. The use of copper wire, also having a diameter of the order of tens of micrometers, has also been proposed. However, such connectors are expensive and do not have sufficiently high current carrying capability and temperature stability.

It is an object of the present invention to provide an electrical connector in which at least some of the aforementioned problems are alleviated.

According to a first aspect of the present invention there is provided an electrical connector for making a connection to a thick film track wherein said connector comprises a plurality of conductive fibres braided together, each of said fibres having a diameter so as to provide sufficient stiffness to said connector and to permit adhesion of said connector to a said thick film track.

The inventor has found that connectors provided in accordance with the invention can be bonded to a thick film heater track using a suitable adhesive and producing a strong bond. This high bond strength is thought to be due to the high surface area of the connector, provided by the plurality of fibres, resulting in excellent wetting by the adhesive.

Furthermore the plurality of fibres provides a structure with a sufficiently large cross-sectional area for a required current-carrying capability but with a degree of flexibility to be effective as a connector. The electrical and mechanical properties of the connector are determined by the number of fibres, which could be of the order of thousands, the diameter of the fibres and the material of which they are made.

The diameter of each fibre is preferably in the range of from 10 $\mu$m to 300 $\mu$m, the most preferred diameter being 12 $\mu$m.

Various metals may be used to make the connector, the most suitable metal for a particular application depending in part on the material of the thick film track to which the connector is to be adhered. Suitable metals include stainless steel, nickel and copper. An advantage of stainless steel is that it is not easily oxidised, an important consideration in view of the fineness of the individual fibres. The temperature stability of the connector is determined by the resistance to oxidation of the connector material—a stainless steel (430 grade) braided connector is stable to at least 750° C.

According to a second aspect of the present invention there is provided a heating unit comprising a thick film track applied to an electrically insulative substrate and an electrically connector according to the first aspect of the present invention connected to said track, wherein the cross-sectional area of the connector is greater than the cross-sectional area of said track.

The current-carrying capability of an electrically conductive structure is determined at least in part by its cross-sectional area. Hence, in a heating unit provided in accordance with said second aspect of the present invention, the current-carrying capability of the connector is less likely to be a limiting factor.

Figure 2:
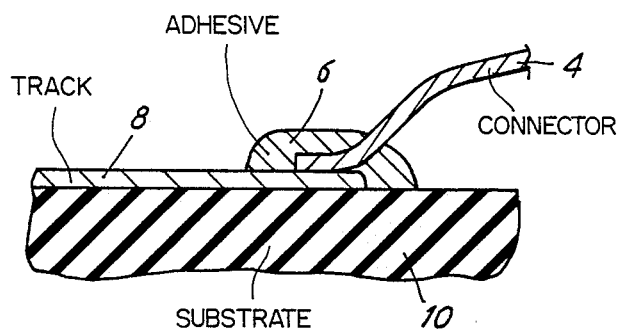

Embodiments of the invention will now be described by way of example only and with reference to the accompanying drawings of which:

FIG. 1 shows one end of a connector provided in accordance with the present invention; and FIG. 2 shows part of a heating unit incorporating such a connector.

In one embodiment, the connector is stainless steel and formed of 1000 individual fibres, each fibre being 12 $\mu$m in diameter. Such a connector has a very low resistance and is capable of carrying a current of tens of Amperes at 240 V.A.C. FIG. 1 shows one end of a connector 2 and illustrates how the fibres 3 are braided together.

FIG. 2 shows a heating unit in which a glass/metal adhesive 6 can be used to adhere the connector 4 to the thick film track 8. Advantageously, the adhesive may be the same conductive ink as used to form the thick film track 8. This permits the same firing process to be used to set the adhesive and form the track. An example of a suitable adhesive for a nickel thick film track comprises nickel and glass in the proportion of 80% to 20% by weight.

A suitable, but non-limiting, method of forming a bond between a connector provided in accordance with the invention and a thick film heater track will now be described hereinafter.

A conductive ink is formed comprising nickel and glass in the proportion of 80% to 20% by weight together with a suitable screen printing medium such as ESL 400. This ink is screen printed in the desired pattern onto a substrate 10. A braided connector 4 formed of a plurality of stainless steel fibres, each fibre being of diameter 12 $\mu$m, has one end flattened. This end is dipped into the aforementioned conductive ink to be wetted by the ink and is then held in position on the track pattern using a suitable positioning means such as a jig. The whole is then dried at 150° C. and fired at a temperature in the range of from 750° C. to 1100° C., producing a connector bonded to a thick film track 8. The firing procedure is preferably carried out in a nitrogen atmosphere to prevent oxidation of the metal.

The jig may hold a number of connectors in position on the track pattern during the manufacturing process.

Further electrical connections can be made to the connector by crimping, soldering or welding another piece of wire onto the other end. The connector may be insulated using a glass or ceramic sleeve.

I claim:

1. An electrical device comprising an electrically insulative substrate; a thick film heater track applied to the substrate, the thick film heater track comprising a metal and a glass material in composition; a connection wire for providing an electrical connection to the thick film heater track; and an electrically conductive adhesive bond for mechanically and electrically connecting the connection wire to the thick film heater track, the adhesive bond comprising a metal and a glass material in composition; wherein the connection wire comprises a multiplicity of conductive fibres having a diameter in the range of from 10 $\mu$m to 300 $\mu$m and arranged to form the connection wire, the connection wire having a deformed end portion to expose the multiplicity of conductive fibres, the end portion of exposed conductive fibres being embedded in the electrically conductive adhesive bond on said thick film heater track so as to provide a mechanical and electrical connection between the connection wire and the thick film heater track.

2. An electrical device according to claim 1 wherein the diameter of each fibre is 12 $\mu$m.

3. An electrical device according to claim 1 wherein the diameter of each fibre is in the range of from 30 $\mu$m to 300 $\mu$m.

4. An electrical device according to any one of the preceding claims wherein said connection wire is formed of stainless steel conductive fibres.

5. An electrical device according to any one of claims 1, 2 or 3 wherein the cross-sectional area of the electrical connection is greater than the cross-sectional area of said track.

6. An electrical device according to claim 4 wherein the cross-sectional area of the electrical connection is greater than the cross-sectional area of said track.

* * * * *